(12) United States Patent
Jin et al.

(10) Patent No.: US 12,279,371 B2
(45) Date of Patent: Apr. 15, 2025

(54) PRINTED CIRCUIT BOARD ASSEMBLY AND ELECTRONIC DEVICE COMPRISING SAME

(71) Applicant: Samsung Electronics Co., Ltd., Suwon-si (KR)

(72) Inventors: Gyeongmin Jin, Suwon-si (KR); Jichul Kim, Suwon-si (KR); Yongjae Song, Suwon-si (KR); Jaeyeon Ra, Suwon-si (KR); Chagyu Song, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 16 days.

(21) Appl. No.: 17/886,327

(22) Filed: Aug. 11, 2022

(65) Prior Publication Data

US 2022/0386465 A1 Dec. 1, 2022

Related U.S. Application Data

(63) Continuation of application No. PCT/KR2021/000450, filed on Jan. 13, 2021.

(30) Foreign Application Priority Data

Feb. 11, 2020 (KR) .................. 10-2020-0016129

(51) Int. Cl.
*H05K 1/14* (2006.01)
*H05K 1/02* (2006.01)

(52) U.S. Cl.
CPC .......... *H05K 1/144* (2013.01); *H05K 1/0218* (2013.01); *H05K 1/0298* (2013.01); *H05K 2201/042* (2013.01); *H05K 2201/10378* (2013.01)

(58) Field of Classification Search
CPC ... H05K 2201/10738; H05K 2201/042; H05K 1/144; H05K 1/141
See application file for complete search history.

(56) References Cited

U.S. PATENT DOCUMENTS 4,489,364 A * 12/1984 Chance ............... H05K 1/0292
257/E23.173
10,674,607 B2 6/2020 Park et al.
(Continued)

FOREIGN PATENT DOCUMENTS

JP 0260185 2/1990
JP H0260185 A 2/1990
(Continued)

OTHER PUBLICATIONS

Extended European Search Report dated Sep. 6, 2023 issued in European Patent Application No. 21753108.6.
(Continued)

*Primary Examiner* — Paresh Paghadal
(74) *Attorney, Agent, or Firm* — Nixon & Vanderhye P.C.

(57) ABSTRACT

Disclosed is a printed circuit board assembly comprising: a first printed circuit board; a second printed circuit board stacked with the first printed circuit board; and an interposer arranged between the first printed circuit board and the second printed circuit board, wherein the second printed circuit board includes a first part and a second part extending in a first direction from a part of the first part and wherein a length of the second part in a second direction perpendicular to the first direction is less than a length in the second direction of the first part, and wherein the direction of a first conductive pattern formed on the first part and the direction of a second conductive pattern formed on the second part are substantially perpendicular to each other.

7 Claims, 10 Drawing Sheets

(56) References Cited

U.S. PATENT DOCUMENTS

| | | | |
|---|---|---|---|
| 2003/0146017 A1* | 8/2003 | Fan | H05K 7/1061 |
| | | | 174/138 G |
| 2003/0173660 A1 | 9/2003 | Kitamura et al. | |
| 2007/0187137 A1 | 8/2007 | Isebo | |
| 2008/0073784 A1 | 3/2008 | Lee | |
| 2014/0022744 A1 | 1/2014 | Joo | |
| 2015/0068032 A1* | 3/2015 | Cok | H10K 50/816 |
| | | | 29/846 |
| 2017/0287807 A1* | 10/2017 | Fain | H01L 23/3675 |
| 2018/0007790 A1* | 1/2018 | Yang | H05K 1/18 |
| 2019/0067819 A1* | 2/2019 | Noh | H01Q 1/52 |
| 2019/0082536 A1 | 3/2019 | Park et al. | |
| 2019/0313529 A1 | 10/2019 | Kim et al. | |
| 2020/0329562 A1* | 10/2020 | Hsieh | H05K 1/144 |

FOREIGN PATENT DOCUMENTS

| | | |
|---|---|---|
| JP | 2003-273289 | 9/2003 |
| JP | 2003-273289 A | 9/2003 |
| JP | 2006-229093 | 8/2006 |
| JP | S5918799 | 5/2016 |
| KR | 10-2007-0083505 | 8/2007 |
| KR | 10-2007-0083505 A | 8/2007 |
| KR | 10-2010-0131754 | 12/2010 |
| KR | 10-2014-0011659 | 1/2014 |
| KR | 10-1389899 | 4/2014 |
| KR | 10-2019-0029215 | 3/2019 |
| KR | 10-2019-0029215 A | 3/2019 |

OTHER PUBLICATIONS

International Search Report dated May 10, 2021, for PCT/KR2021/000450, 5 pp.
Written Opinion of the ISA dated May 10, 2021, for PCT/KR2021/000450, 8 pp.
India Office Action dated Feb. 9, 2024 for IN Application No. 202217051411.
Chinese Office Action dated Mar. 27, 2024 for CN Application No. 202180014158.2.
Korean Office Action dated Jul. 17, 2024 for KR Application No. 10-2020-0016129.
Chinese Office Action dated Nov. 27, 2024 for CN Application No. 202180014158.2.
Korean Office Action dated Feb. 20, 2025 for KR Application No. 10-2020-0016129.

* cited by examiner (601)

(602)

|  | Cu Size Inside Protrusion Part | PPG Size Inside Protrusion Part | Cu Area(%) | Cu Pattern Ratio | Slave PCB Warpage | |
|---|---|---|---|---|---|---|
| 910 | 0.2mm | 0.2mm | 50% | 3% | Smile | 23um |
| 920 | 0.4mm | 0.4mm | 50% | 5% | Crying | 68um |
| 930 | 0.6mm | 0.6mm | 50% | 8% | Crying | 31um |
| 940 | 0.2mm | 0.6mm | 25% | 3% | Crying | 31um |

FIG.9

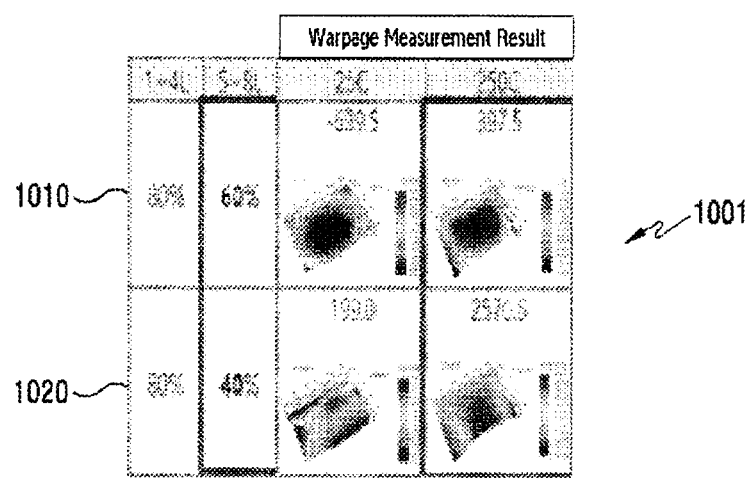
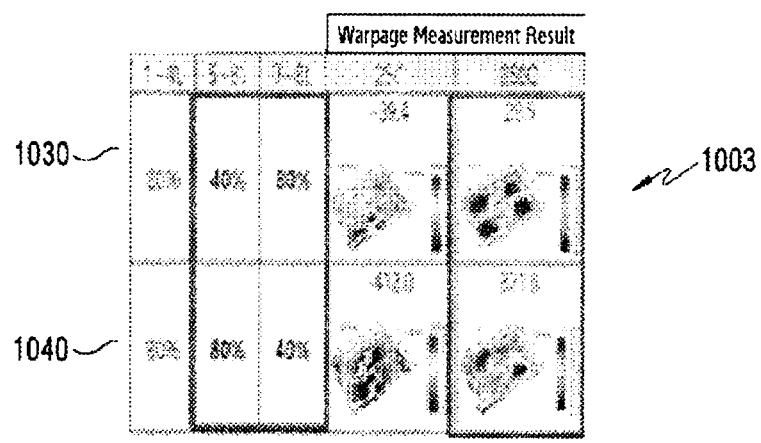

PRINTED CIRCUIT BOARD ASSEMBLY AND ELECTRONIC DEVICE COMPRISING SAME

CROSS-REFERENCE TO RELATED APPLICATIONS

This application is a continuation of International Application No. PCT/KR2021/000450 designating the United States, filed on Jan. 13, 2021, in the Korean Intellectual Property Receiving Office and claiming priority to Korean Patent Application No. 10-2020-0016129, filed on Feb. 11, 2020, in the Korean Intellectual Property Office, the disclosures of which are incorporated by reference herein in their entireties.

BACKGROUND

Field

The disclosure relates to a printed circuit board assembly and an electronic device including the same.

Description of Related Art

An electronic device such as a smart phone can include various electronic components in order to perform various functions. These electronic components can be mounted on a printed circuit board, and the printed circuit board can be arranged inside the electronic device.

The electronic components can be mounted on the printed circuit board through a surface mounting technology (SMT). In a process of mounting the electronic components on the printed circuit board through a reflow process or the like of the surface mount technology, the printed circuit board can be in a high temperature state, and in this high temperature state, a warpage phenomenon can occur. Since defects can occur in surface mounting between the printed circuit board and the electronic components in a warpage state of the printed circuit board, a way of suppressing this warpage phenomenon or controlling a warpage direction to appear in an intended direction is being considered.

Meanwhile, with the miniaturization and thinning of electronic devices, the high integration of electronic components is rapidly progressing, and this trend requires various changes even in printed circuit boards. For example, a printed circuit board assembly (PCB assembly) in which a plurality of printed circuit boards are stacked by arranging an interposer between the plurality of printed circuit boards is being developed. This printed circuit board assembly can include more electronic components within a limited mounting space of the electronic device.

Even in the printed circuit board assembly in which the plurality of printed circuit boards are stacked, the warpage phenomenon can occur at a high temperature. To prevent/reduce defects generation caused by the warpage phenomenon, design and development are in progress to make identical warpage directions of the plurality of printed circuit boards.

To control warpage directions of a plurality of printed circuit boards included in a printed circuit board assembly to be similar or identical to each other, the printed circuit board can be designed in a method of adjusting a ratio of an area occupied by copper (Cu) for each layer of the printed circuit board.

Due to design constraints of the printed circuit board or the printed circuit board assembly, it can be difficult to adjust the ratio of the area occupied by copper for each layer. For example, in a protrusion part of the printed circuit board where a lot of non-wet defects can occur, there is a limit to controlling the warpage direction only by adjusting the ratio of the area occupied by copper for each layer.

SUMMARY

Embodiments of the disclosure may provide a printed circuit board assembly and an electronic device including the same, in which a conductive pattern formed in a protrusion part of at least one of a plurality of printed circuit boards included in the printed circuit board assembly is used to control warpage directions of the printed circuit boards.

A printed circuit board assembly according to various example embodiments of the present disclosure may include: a first printed circuit board, a second printed circuit board stacked with the first printed circuit board, and an interposer arranged between the first printed circuit board and the second printed circuit board. The second printed circuit board may include a first part, and a second part extending from a part of the first part in a first direction and wherein a length of the second part in a second direction perpendicular to the first direction is less than a length of the first part in the second direction. A direction of a first conductive pattern formed in the first part and a direction of a second conductive pattern formed in the second part may be substantially perpendicular to each other.

An electronic device according to various example embodiments of the present disclosure may include: a housing including a first surface facing in a first direction, a second surface facing in a second direction opposite to the first direction, and a side surface surrounding at least a part of a space formed between the first surface and the second surface, a printed circuit board assembly arranged inside the housing, and at least one electronic component mounted on the printed circuit board assembly. The printed circuit board assembly may include: a first printed circuit board, a second printed circuit board stacked with the first printed circuit board, and an interposer arranged between the first printed circuit board and the second printed circuit board. The second printed circuit board may include a first part; and a second part extending from a part of the first part in a third direction and wherein a length of the second part in a fourth direction perpendicular to the third direction is less than a length of the first part in the fourth direction. The direction of the first conductive pattern formed in the first part and the direction of the second conductive pattern formed in the second part may be substantially perpendicular to each other.

A printed circuit board according to various example embodiments of the present disclosure may include: a first part; and a second part extending from a part of the first part in a first direction and wherein a length of the second part in a second direction perpendicular to the first direction is less than a length of the first part in the second direction. A direction of a first conductive pattern formed in the first part and a direction of a second conductive pattern formed in the second part may be substantially perpendicular to each other.

According to various example embodiments of the present disclosure, the mountability of electronic components and/or the reliability of a printed circuit board assembly or an electronic device including the same may be increased by controlling warpage directions of a plurality of printed circuit boards included in the printed circuit board assembly to be similar or identical to each other.

In addition, various effects directly or indirectly identified through this disclosure may be provided.

BRIEF DESCRIPTION OF THE DRAWINGS

The above and other aspects, features and advantages of certain embodiments of the present disclosure will be more apparent from the following detailed description, taken in conjunction with the accompanying drawings, in which:

FIG. 9 is a table showing a warpage direction and warpage size of a printed circuit board dependent on a ratio of a conductive pattern formed in a protrusion part of the printed circuit board and a ratio of a conductor included in the printed circuit board according to various embodiments; and FIG. 10 is a table showing a warpage direction and warpage size of a printed circuit board dependent on a location of a layer of the printed circuit board on which a conductive pattern is formed according to various embodiments.

In connection with a description of the drawings, the same or similar reference numerals may be used for the same or similar components.

DETAILED DESCRIPTION

Figure 1:
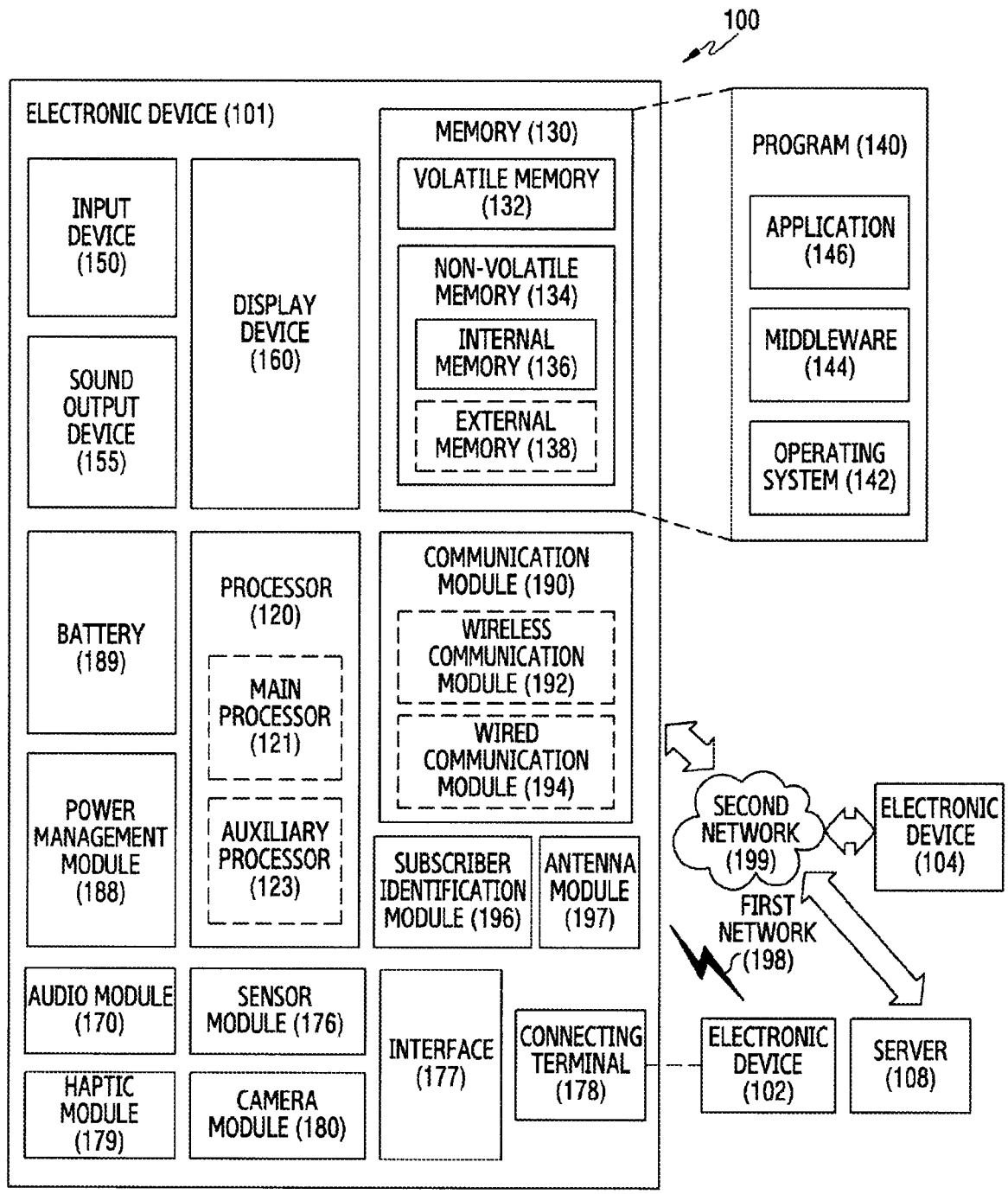
FIG. 1 is a block diagram illustrating an example electronic device in a network environment according to various embodiments.

Hereinafter, various example embodiments of the present disclosure will be described in greater detail with reference to the accompanying drawings. For ease of description sake, sizes of components shown in the drawings may be exaggerated or reduced, and the present disclosure is not necessarily limited as illustrated.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semisupervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
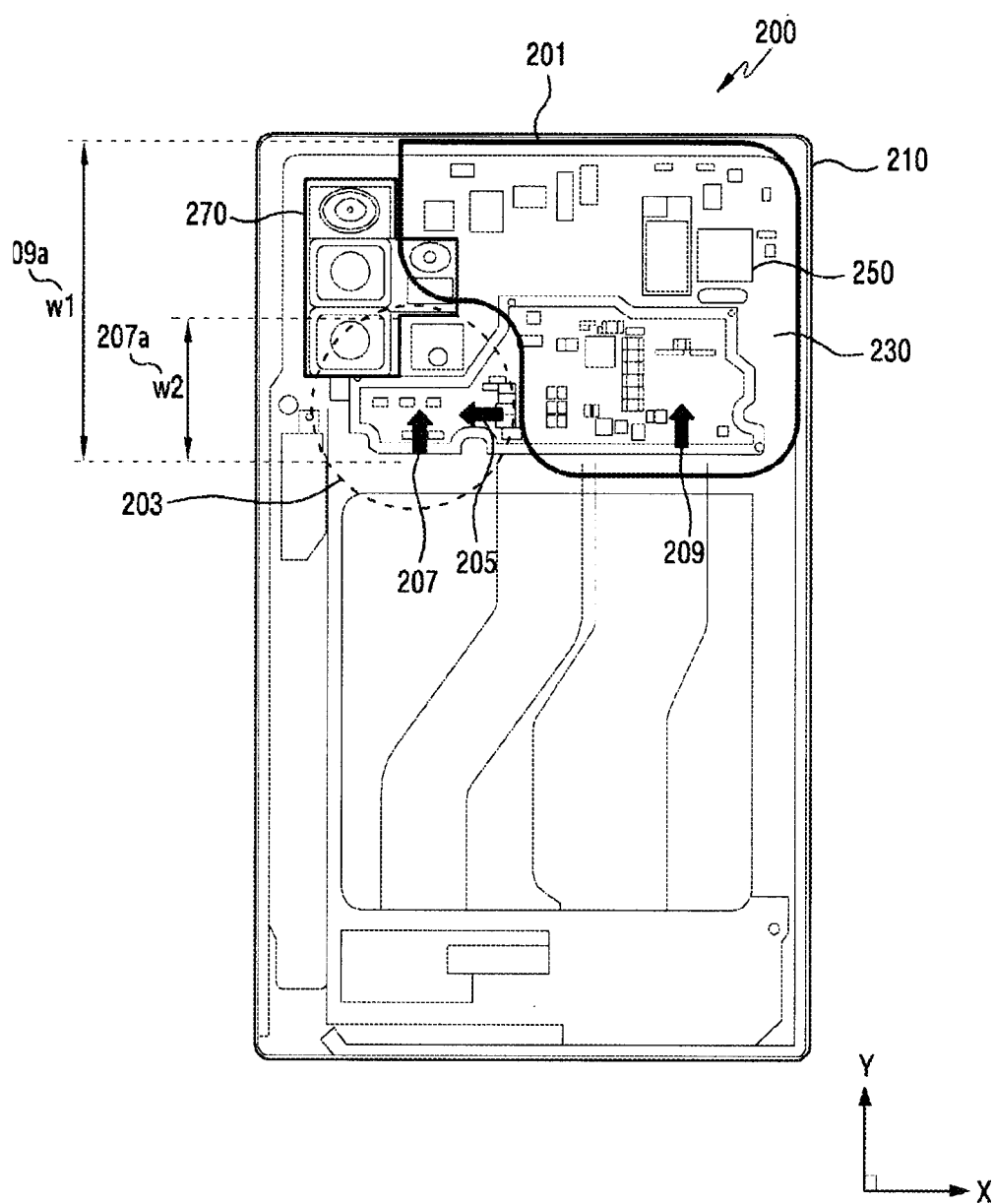
FIG. 2 is a diagram illustrating an example electronic device including a printed circuit board assembly according to various embodiments.
Figure 3:
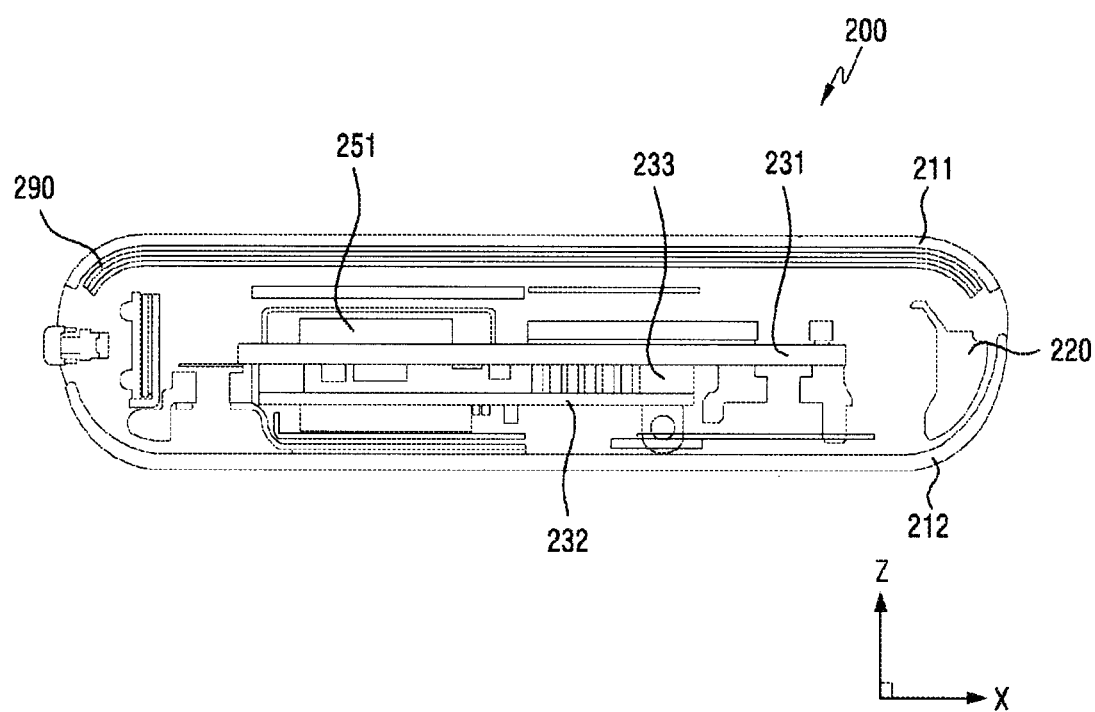
FIG. 3 is a cross-sectional view of an electronic device including a printed circuit board assembly according to various embodiments.

FIG. 2 is a diagram illustrating an example electronic device including a printed circuit board assembly according to various embodiments, and FIG. 3 is a cross-sectional view of the electronic device including the printed circuit board assembly according to various embodiments.

Referring to FIG. 2 and FIG. 3, the electronic device 200 (e.g., the electronic device 101 of FIG. 1) may include a housing 210, a printed circuit board assembly 230 arranged inside the housing 210, and at least one electronic component 250 mounted on the printed circuit board assembly 230. However, the construction of the electronic device 200 is not limited thereto. According to various embodiments, the electronic device 200 may further include at least one other component in addition to the above-described components. Since at least one of the components of the electronic device 200 of FIG. 2 and FIG. 3 (e.g., the electronic device 101 of FIG. 1) of various embodiments is the same as or similar to at least one of the components of the electronic device 101 of FIG. 1, a repeated description may not be repeated below.

According to various embodiments, the housing 210 may include a first surface (or a front surface) facing in a first direction (e.g., a Z-axis direction), a second surface (or a rear surface) facing in a second direction (e.g., a −Z-axis direction) opposite to the first direction, and a side surface surrounding at least a part of a space formed between the first surface and the second surface. In an embodiment (not shown), the housing 210 may refer to a structure forming a part of the first surface, the second surface, and the side surface as well.

According to various embodiments, at least a part of the first surface may be formed by a substantially transparent front plate 211. The second surface may be formed by a substantially opaque rear plate 212. The front plate 211 may include, for example, a glass plate or polymer plate including various coating layers. The rear plate 212 may be formed by, for example, a coated or tinted glass, a ceramic, a polymer, a metal (e.g., aluminum, stainless steel (STS), or magnesium), or a combination of at least two of the above materials. The side surface may be formed by a side bezel structure (or a side member) (e.g., a support member 220 of FIG. 3) that is coupled to the front plate 211 and the rear plate 212 and includes a metal and/or a polymer. In various embodiments, the rear plate 212 and the side bezel structure may be integrally formed and may include the same material (e.g., a metal material such as aluminum).

The printed circuit board assembly 230 may include a plurality of printed circuit boards 231 and 232 on which the at least one electronic component 250 is mounted, and an interposer 233 arranged between the plurality of printed circuit boards 231 and 232. FIG. 3 shows a state in which the plurality of printed circuit boards 231 and 232 include a first printed circuit board 231 and a second printed circuit board 232 for convenience of description, but the present disclosure is not limited thereto and may further include at least one other printed circuit board. In the following description, the first printed circuit board 231 and the second printed circuit board 232 may be referred to as a master printed circuit board (master PCB) and a slave printed circuit board (slave PCB), respectively.

The first printed circuit board 231 and the second printed circuit board 232 may be stacked with the interposer 233 interposed therebetween.

According to an embodiment, the first printed circuit board 231 may be arranged between the front plate 211 and the rear plate 212, and the at least one electronic component 250 may be mounted on at least one surface of the first printed circuit board 231. In an example, the electronic component 250 having a relatively large weight, such as a processor 251 (e.g., an application processor (AP), a communication processor (CP), and/or the processor 120 FIG. 1) or a memory (e.g., a universal flash storage (UFS) and/or the memory 130 of FIG. 1), may be mounted on one surface of the first printed circuit board 231 in a direction in which the front plate 211 is arranged. According to an embodiment, the first printed circuit board 231 may be convexly warped, in a high temperature state, in a direction (e.g., a −Z-axis direction) in which the rear plate 212 is arranged, due to a difference of balance of conductive patterns for each layer included in the first printed circuit board 231. For example, in the first printed circuit board 231, a size of an area of a conductive pattern formed in a layer close to the direction (e.g., the Z-axis direction) in which the front plate 211 is arranged from the center of the first printed circuit board 231 may be less than a size of an area of a conductive pattern formed in a layer close to the direction (e.g., the −Z axis direction) in which the rear plate 212 is arranged from the center of the first printed circuit board 231. Accordingly, the first printed circuit board 231 may be convexly warped, in a high temperature state, in a direction (e.g., the direction in which the rear plate 212 is arranged) of a layer in which an area of a conductive pattern is relatively large. In the following description, this warpage direction of the first printed circuit board 231 may be referred to as a smile direction.

According to an embodiment, the second printed circuit board 232 may be arranged between the first printed circuit board 231 and the rear plate 212, and the at least one electronic component 250 may be mounted on at least one surface of the second printed circuit board 232. The second printed circuit board 232 may include a first part 201, and a second part 203 extending from a part of the first part 201 in one direction 205. According to an embodiment, a width (w2) 207a of the second part 203 in a direction 207 perpendicular to the direction 205 extending from a part of the first part 201 may be less than a width (w1) 209a of the first part 201 in the same direction 209. For example, the first part 201 represents a main part (or a central part) in the entire shape of the second printed circuit board 232, and the second part 203 represents a protruded part (protrusion part) in the entire shape of the second printed circuit board 232. In the following description, the first part 201 may be referred to as the main part, and the second part 203 may be referred to as the protrusion part. As the second printed circuit board 232 has the protrusion part 203, the second printed circuit board 232 may be arranged adjacent to another component (e.g., the camera module 270 and/or the camera of FIG. 1) of the electronic device 200. Accordingly, the components may be more efficiently arranged in an internal space of the electronic device 200.

According to an embodiment, the second printed circuit board 232 may have a warpage direction similar to or the same as a warpage direction of the first printed circuit board 231 in a room temperature and high temperature state. For example, the warpage direction of the second printed circuit board 232 may be controlled in a direction similar to or the same as the warpage direction of the first printed circuit board 231, using a conductive pattern formed in the protrusion part 203 of the second printed circuit board 232 in which a plurality of non-wet defects may occur. According to an embodiment, the warpage direction of the second printed circuit board 232 may be controlled using at least one of a direction of the conductive pattern formed in the protrusion part 203 of the second printed circuit board 232, a ratio (or a size) of the conductive pattern, or a location of a layer of the printed circuit board on which the conductive pattern is formed. A method or structure for controlling the warpage direction of the second printed circuit board 232 will be described in greater detail below with reference to FIG. 5 to FIG. 10.

According to various embodiments, the disclosure is not limited to the illustrated embodiment, and a location of the second part 203 may be changed according to various embodiments. According to an embodiment, at least a part of the first printed circuit board 231 may be formed, similarly or identically to the second part 203, as a part (protrusion part) protruded from the entire shape of the first printed circuit board 231. According to various embodiments, the protrusion parts formed on the first printed circuit board 231 and the second printed circuit board 232 may be formed similarly or identically to each other and arranged in the electronic device 200.

The electronic component 250 may include, for example, at least one of a processor 251, a memory, a PMIC, and/or an interface. The processor 251 may include various processing circuitry and control at least one other component of the electronic device 200, and may perform various data processing or operations. The processor 251 may include, for example, one or more of a central processing unit, an application processor, a graphic processing unit, an image signal processor, a sensor hub processor, and a communication processor. The memory may store various data used by at least one component of the electronic device 200. The memory may include, for example, a volatile memory or a non-volatile memory. The PMIC may manage power supplied to the electronic device 200. The interface may include various interface circuitry including, for example, a high definition multimedia interface (HDMI), a universal serial bus (USB) interface, an SD card interface, and/or an audio interface. The interface may, for example, electrically or physically connect the electronic device 200 to an external electronic device, and may include a USB connector, an SD card/MMC connector, or an audio connector.

According to an embodiment, the electronic device 200 may further include at least one of a camera module (e.g., including a camera) 270, a display 290, and a support member 220 (e.g., a bracket).

The camera module 270 may capture still images and moving images. The camera module 270 may include a first camera device arranged on a first surface of the housing 210, a second camera device arranged on a second surface of the housing 210, and/or a flash. The camera devices may include one or more lenses, image sensors, and/or image signal processors. The flash may include, for example, a light emitting diode or a xenon lamp. In various embodiments, two or more lenses (infrared camera, wide angle and telephoto lens) and image sensors may be arranged on at least one surface of the housing 210.

In various embodiments, the camera module 270 may be arranged inside the housing 210 wherein a lens of the camera module 270 is exposed to at least a part of a first surface (a front surface) of the electronic device 200. For example, the camera module 270 may include a punch hole camera arranged inside a hole or recess (not shown) formed in a rear surface of the display 290. In various embodiments, the camera module 270 may be arranged inside the housing 210 wherein the lens of the camera module 270 is exposed to at least a part of a second surface (a rear surface) of the electronic device 200. For example, the camera module 270 may be arranged on or functionally connected to the printed circuit board assembly 230.

The display 290 may display various contents (e.g., a text, an image, a video, an icon or a symbol, etc.) to a user. The display 290 may be visible through, for example, a substantial part of the front plate 211. In various embodiments, at least a part of the display 290 may be visible through the front plate 211 forming a partial area of the first surface (or front surface) and side surface of the housing 210. According to an embodiment, the display 290 may be coupled to or arranged adjacent to a touch sensing circuit, a pressure sensor capable of measuring the intensity (pressure) of a touch, and/or a digitizer detecting a magnetic field type stylus pen.

The support member 220 may include a bracket arranged inside the electronic device 200 and be connected to the side bezel structure or be formed integrally with the side bezel structure. The support member 220 may be formed of, for example, a metal material and/or a non-metal (e.g., polymer) material. The display 290 may be coupled to one surface of the support member 220 and the printed circuit board assembly 230 may be coupled to the other surface of the support member 220.

Figure 4:
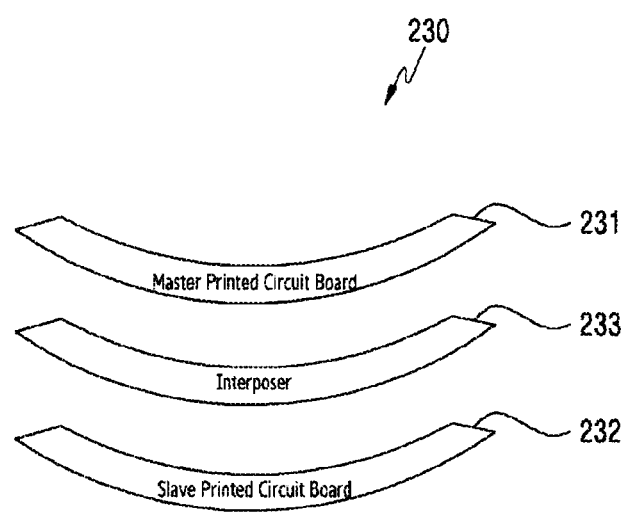
FIG. 4 is a diagram illustrating warpage directions of a plurality of printed circuit boards included in a printed circuit board assembly according to various embodiments.

FIG. 4 is a diagram illustrating warpage directions of a plurality of printed circuit boards included in a printed circuit board assembly according to various embodiments.

Referring to FIG. 4, the printed circuit board assembly 230 may include a master printed circuit board 231, a slave printed circuit board 232, and an interposer 233. The master printed circuit board 231 and the slave printed circuit board 232 may be stacked with the interposer 233 interposed therebetween. For example, the interposer 233 may be stacked on the slave printed circuit board 232, and the master printed circuit board 231 may be stacked on the interposer 233.

The master printed circuit board 231 may be convexly warped in a rear direction (e.g., a direction facing the interposer 233), in a high temperature state, due to a difference of balance of a conductive pattern for each layer included in the master printed circuit board 231. According to an embodiment, in the master printed circuit board 231, a size of an area of a conductive pattern formed on a layer ranging from the center of the master printed circuit board 231 to a rear surface (a surface facing the interposer 233) of the master printed circuit board 231 may be greater than a size of an area of a conductive pattern formed on a layer ranging from the center of the master printed circuit board 231 to a front surface (a surface opposite to the rear surface) of the master printed circuit board 231. For example, in the master printed circuit board 231, the size of the area of the conductive pattern formed on the rear surface of the master printed circuit board 231 may be greater than the size of the area of the conductive pattern formed on the front surface of the master printed circuit board 231. Accordingly, as shown in FIG. 4, the warpage direction of the master printed circuit board 231 in the high temperature state may be a smile direction that is convexly warped in a direction (e.g., a rear direction) of a layer in which the area of the conductive pattern is formed relatively large.

To prevent and/or reduce a surface mounted device (SMD) process failure between the master printed circuit board 231 and the slave printed circuit board 232, the warpage directions of the master printed circuit board 231 and the slave printed circuit board 232 may be controlled in a similar or identical direction. For example, as shown in FIG. 4, when the warpage direction of the master printed circuit board 231 is the smile direction in the high temperature state, even the warpage direction of the slave printed circuit board 232 may be controlled to be the smile direction.

According to an embodiment, the warpage direction of the slave printed circuit board 232 may be controlled to be the smile direction, using at least one of a direction of a conductive pattern formed in the protrusion part 203 of the slave printed circuit board 232, a ratio (or size) of the conductive pattern, or a location of a layer of the slave printed circuit board 232 on which the conductive pattern is formed. Referring to FIGS. 2 and 3, protrusion part 203 of the slave printed circuit board 232 is part extending from a part of a main part (or a central part) 201 of the slave printed circuit board 232, and the width (w2) 207a of the protrusion part 203 in the direction 207 (e.g., a short axis direction of the slave printed circuit board 232) perpendicular to the direction 205 (e.g., a long axis direction of the slave printed circuit board 232) extending from a part of the main part 201 may be less than the width (w1) 209a of the main part 201 in the same direction 209 (e.g., the short axis direction of the slave printed circuit board 232).

Figure 5:
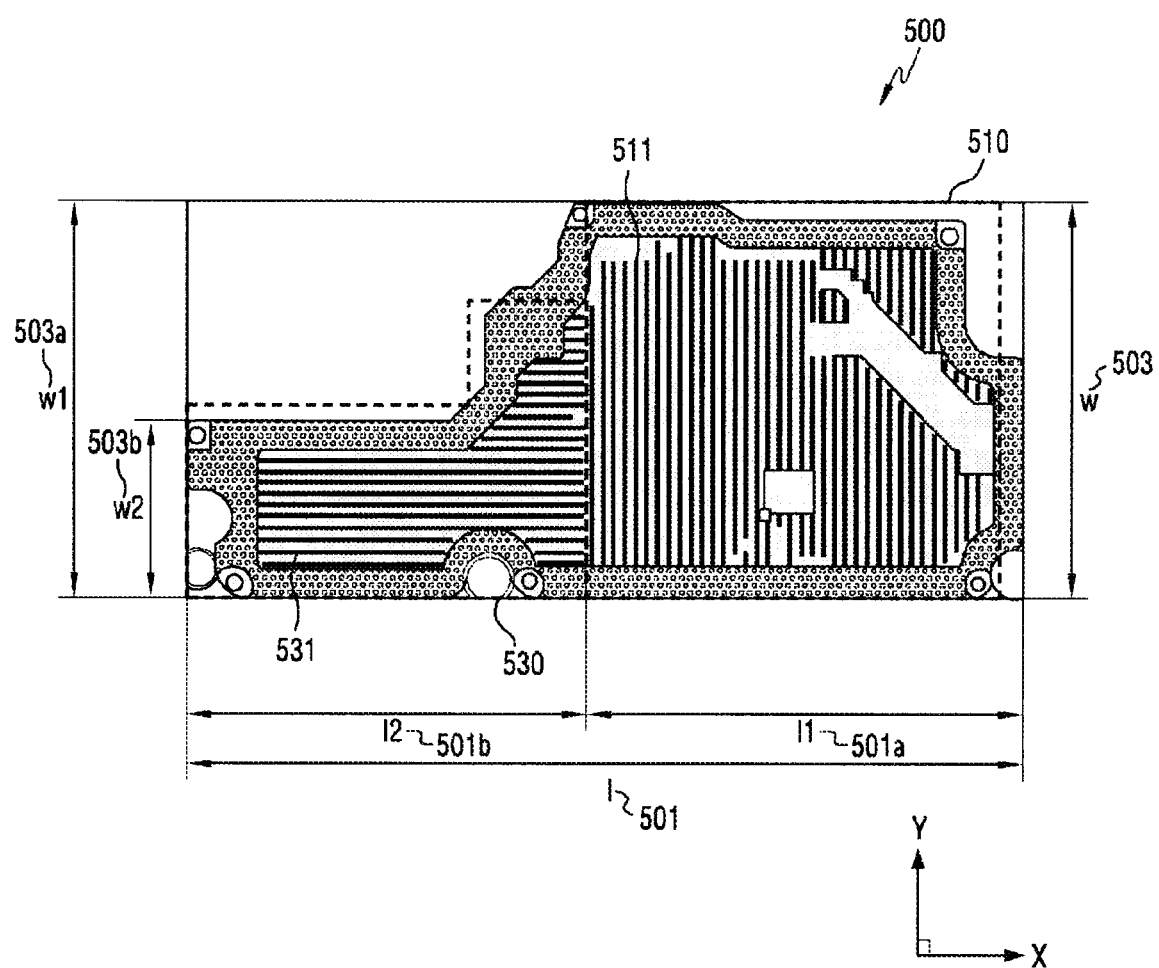
FIG. 5 is a diagram illustrating a printed circuit board included in a printed circuit board assembly according to various embodiments.

FIG. 5 is a diagram illustrating a printed circuit board included in a printed circuit board assembly according to various embodiments.

The printed circuit board assembly 230 may include a plurality of printed circuit boards, for example, a master printed circuit board (e.g., the master printed circuit board 231 of FIG. 4) and a slave printed circuit board (e.g., the slave printed circuit board 232 of FIG. 4). The printed circuit board 500 shown in FIG. 5 may be any one or two or more of the plurality of printed circuit boards. For example, the printed circuit board 500 may be at least one of the master printed circuit board (e.g., the master printed circuit board 231 of FIG. 4) or the slave printed circuit board (e.g., the slave printed circuit board 232 of FIG. 4). Since at least one of the components of the printed circuit board 500 of various embodiments is the same as or similar to at least one of the components of the printed circuit board assembly 230 of FIG. 2 to FIG. 4, and a repeated description may not be provided. In the above description, it has been described that the warpage direction of the slave printed circuit board 232 is controlled to be similar or identical to the warpage direction of the master printed circuit board 231 using the conductive pattern formed in the protrusion part of the slave printed circuit board 232, but the present disclosure is not limited thereto. According to various embodiments, warpage directions of the plurality of printed circuit boards may be controlled in a similar or identical direction using a conductive pattern formed in a protrusion part of at least one (e.g., the master printed circuit board 231 and/or the slave printed circuit board 232) of the plurality of printed circuit boards.

Referring to FIG. 5, the printed circuit board 500 may include a first part 510 (e.g., the first part 201 of FIG. 2) and a second part 530 (e.g., the second part 203 of FIG. 2). The first part 510 is part occupying most of an area of the printed circuit board 500, and may be referred to as a main part (or a central part). The second part 530 is part extending from a part of the first part 510, and may be referred to as a protrusion part.

The sum of a length (l1) 501a of the first part 510 and a length (l2) 501b of the second part 530 may correspond to a length (l) 501 of the printed circuit board 500. The length 501 of the printed circuit board 500 may indicate a length of a long axis (e.g., X axis) direction of the printed circuit board 500. In the following description, the long axis direction of the printed circuit board 500 may be referred to as a length 501 direction.

The first part 510 may have a width (w1) 503a corresponding to a width (w) 503 of the printed circuit board 500, and the second part 530 may have a width (w2) 503b less than the width 503 of the printed circuit board 500. Here, the width 503 of the printed circuit board 500 may indicate a length of a short axis (e.g., Y axis) direction of the printed circuit board 500. In the following description, the short axis direction of the printed circuit board 500 may be referred to as a width 503 direction.

The second part 530 may extend from a part of the first part 510. For example, the second part 530 may extend from a part of the first part 510 in the length 501 direction. In this case, a length (or width) (w2) 503b of the second part 530 in the width 503 direction may be less than a length (or width) (w1) 503a of the first part 510 in the width 530 direction.

The warpage direction of the printed circuit board 500 may be controlled 500 using at least one of a direction of a conductive pattern 531 formed in the second part 530 of the printed circuit board 500, a ratio (or size) of the conductive pattern 531, or a location of a layer of the printed circuit board 500 on which the conductive pattern 531 is formed. According to an embodiment, a first conductive pattern 511 formed in the first part 510 and/or the second conductive pattern 531 formed in the second part 530 may form a ground region of the printed circuit board 500. For example, the first conductive pattern 511 and/or the second conductive pattern 531 may be formed on a ground layer of the printed circuit board 500.

According to an embodiment, a direction of the second conductive pattern 531 may be different from a direction of the first conductive pattern 511. In an example, the direction of the first conductive pattern 511 and the direction of the second conductive pattern 531 may be substantially perpendicular to each other. As shown in FIG. 5, the direction of the first conductive pattern 511 may be the width 503 direction, and the direction of the second conductive pattern 531 may be the length 501 direction. In another example, the direction of the second conductive pattern 531 may be a direction oblique at a predetermined angle to the direction of the first conductive pattern 511. According to an embodiment, the direction of the second conductive pattern 531 may be a direction that is substantially the same as a direction (e.g., the length 501 direction) in which the second part 530 extends from a part of the first part 510. For example, when the second part 530 extends in a first direction (e.g., an −X-axis direction) from a part of the first part 510, the direction of the second conductive pattern 531 may be the first direction (the −X-axis direction). In this case, the direction of the first conductive pattern 511 may be a second direction different from the first direction, for example, be a direction (e.g., a Y-axis direction) substantially perpendicular to the first direction.

According to an embodiment, a ratio of a width (e.g., a length of the second conductive pattern 531 in the width 503 direction) of the second conductive pattern 531 to a length (e.g., the length (or the width) (w2) 503b of the second part 530 in the width 503 direction) of the second part 530 in a direction (e.g., the width 503 direction) perpendicular to the direction (e.g., the length 501 direction) in which the second part 530 extends from a part of the first part 510 may be less than a specified amount (e.g., 5%). Since an elastic modulus increases as the width of the second conductive pattern 531 decreases, it may be easy to control the warpage direction of the printed circuit board 500. For example, it may be easy to control the warpage direction of the printed circuit board 500 to be the smile direction in a high temperature state of the printed circuit board 500.

According to an embodiment, a ratio of an area occupied by a conductor (e.g., the first conductive pattern 511 and the second conductive pattern 531) included in the printed circuit board 500 to the entire area (e.g., an area including the first part 510 and the second part 530) of the printed circuit board 500 may be included within a specified range (e.g., 50% to 75%). A coefficient of thermal expansion of the conductor (e.g., copper) increases in proportion to its volume, but a mismatch with an insulating layer (e.g., a prepreg (PPG) layer) may increase at a high temperature.

According to an embodiment, the ratio of the area occupied by the conductor included in the printed circuit board 500 to the entire area of the printed circuit board 500 may be included within the specified range (e.g., 50% to 75%), and a ratio of a width of the second conductive pattern 531 to a length (or a width) (w2) 503b of the second part 530 in the width 503 direction may be less than a specified amount (e.g., 5%). For example, in a state in which the area occupied by the conductor on the printed circuit board 500 is specified, as the width of the second conductive pattern 531 decreases, the second conductive pattern 531 may be arranged more densely in the second part 530.

According to an embodiment, the printed circuit board 500 may include a plurality of layers. The plurality of layers may include a plurality of conductive layers (e.g., copper foil layers) used as a signal line and/or a ground region, and a plurality of insulating layers arranged between the conductive layers. According to an embodiment, the first conductive pattern 511 and/or the second conductive pattern 531 may form a ground region of the printed circuit board 500. For example, the first conductive pattern 511 and/or the second conductive pattern 531 may be formed on a ground layer among the plurality of layers. The first conductive pattern 511 and/or the second conductive pattern 531 may be formed on a conductive layer (ground layer) used as the ground region except a region where the signal line is arranged, among the plurality of conductive layers.

According to an embodiment, when the printed circuit board 500 includes the plurality of layers, the first conductive pattern 511 and the second conductive pattern 531 may be formed on at least one layer spaced a specified distance or more apart from the center of the printed circuit substrate 500, among the plurality of layers. In an example, the first conductive pattern 511 and the second conductive pattern 531 may be formed on an outermost layer of the printed circuit board 500. Since a moment effect increases as the first conductive pattern 511 and the second conductive pattern 531 move away from the center of the printed circuit board 500, it may be easy to control the warpage direction of the printed circuit board 500.

FIG. 5 illustrates a state in which the printed circuit board 500 includes one second part 530, but the present disclosure is not limited thereto. According to various embodiments, the printed circuit board 500 may include a plurality of second parts 530. When the printed circuit board 500 includes the plurality of second parts 530, at least one of the plurality of second parts 530 may extend from a part of the first part 510 in a first direction (e.g., an –X-axis direction), and at least one other may extend from another part of the first part 510 in a second direction (e.g., an X-axis direction) different from the first direction. The direction in which the second part 530 extends and/or the number of the second parts 530 may vary.

According to an embodiment, when the printed circuit board 500 includes the plurality of second parts 530, directions of conductive patterns 531 formed in the plurality of second parts 530 may be the same as each other. In this case, the directions of the conductive patterns 531 formed in the plurality of second parts 530 may be different from the direction of the conductive pattern 511 formed in the first part 510. In an example, when the direction of the conductive pattern 511 formed in the first part 510 is the width 503 direction, the directions of the conductive pattern 531 formed in the plurality of second parts 530 may be the length 501 direction.

According to an embodiment, when the printed circuit board 500 includes the plurality of second parts 530, the directions of the conductive patterns 531 formed in the plurality of second parts 530 may be substantially the same as a direction in which each of the plurality of second parts 530 extends from a part of the first part 510. For example, the direction of the conductive pattern 531 formed in the second part 530 that extends from a part of the first part 510 in the first direction (e.g., the –X-axis direction) may be the first direction (e.g., the –X-axis direction), and the direction of the conductive pattern 531 formed in the second part 530 that extends from another part of the first part 510 in the second direction (e.g., the Y-axis direction) different from the first direction may be the second direction (e.g., the Y-axis direction). In this case, a direction of the conductive pattern 531 formed in any one second part 530 among the plurality of second parts 530 may be a direction substantially the same as the direction of the conductive pattern 511 formed in the first part 510. According to an embodiment, the direction of the conductive pattern 531 formed in the second part 530 may be set to be oblique at a predetermined angle with the direction of the conductive pattern 511 formed in the first part 510, wherein the direction of the conductive pattern 531 formed in any one second part 530 among the plurality of second parts 530 is not a direction that is the same as the direction of the conductive pattern 511 formed in the first part 510.

According to various example embodiments, a printed circuit board assembly (e.g., the printed circuit board assembly 230) may include: a first printed circuit board (e.g., the master printed circuit board 231), a second printed circuit board (e.g., the slave printed circuit board 232 or the printed circuit board 500) stacked with the first printed circuit board, and an interposer (e.g., the interposer 233) arranged between the first printed circuit board and the second printed circuit board. The second printed circuit board may include a first part (e.g., the main part 201 or the first part 510), and a second part (e.g., the protrusion part 203 or the second part 530) extending from a part of the first part in a first direction (e.g., the direction 205 or the length 501 direction) and having a length (e.g., the width (w2) 207a or the width (w2) 503b) in a second direction (e.g., the direction 207 or 209 or the width 503 direction) perpendicular to the first direction less than a length (e.g., the width (w1) 209a or the width (w1) 503a) of the first part in the second direction. A direction of a first conductive pattern (e.g., the first conductive pattern 511) formed in the first part and a direction of a second conductive pattern (e.g., the second conductive pattern 531) formed in the second part may be substantially perpendicular to each other.

According to various example embodiments, the first conductive pattern and the second conductive pattern may be formed on a ground layer of the second printed circuit board.

According to various example embodiments, the first printed circuit board may include a first surface facing the second printed circuit board and a second surface facing the first surface. A size of an area occupied by a conductor formed from the center of the first printed circuit board to the first surface of the first printed circuit board may be greater than a size of an area occupied by a conductor formed from the center of the first printed circuit board to the second surface of the first printed circuit board.

According to various example embodiments, the direction of the first conductive pattern may be the second direction, and the direction of the second conductive pattern may be the first direction.

According to various example embodiments, a ratio of an area occupied by a conductor included in the second printed circuit board to the entire area of the second printed circuit board may be within a specified range. A ratio of a length of the second conductive pattern in the second direction to a length of the second part in the second direction may be less than a specified ratio.

According to various example embodiments, the second printed circuit board may include a plurality of layers. The first conductive pattern and the second conductive pattern may be formed on at least one layer spaced a specified distance or more apart from the center of the second printed circuit board among the plurality of layers.

According to various example embodiments, the at least one layer may have a greater spaced distance with the first printed circuit board than at least one another layer among the plurality of layers.

According to various example embodiments, the first printed circuit board may include a first surface facing the second printed circuit board and a second surface facing the first surface, and a weight of at least one electronic component mounted on the first surface may be greater than a weight of at least one electronic component mounted on the second surface.

According to various example embodiments, the direction of the first conductive pattern may be a short axis direction of the second printed circuit board, and the direction of the second conductive pattern may be a long axis direction of the second printed circuit board.

According to various example embodiments, an electronic device (e.g., the electronic device 101 or the electronic device 200) may include: a housing (e.g., the housing 210) including a first surface (e.g., the front plate 211) facing in a first direction, a second surface (e.g., the rear plate 212) facing in a second direction opposite to the first direction, and a side surface surrounding at least a part of a space formed between the first surface and the second surface, a printed circuit board assembly (e.g., the printed circuit board assembly 230) arranged inside the housing, and at least one electronic component (e.g., the electronic component 250 or the processor 251) mounted on the printed circuit board assembly. The printed circuit board assembly may include: a first printed circuit board (e.g., the master printed circuit board 231), a second printed circuit board (e.g., the slave printed circuit board 232 or the printed circuit board 500) stacked with the first printed circuit board, and an interposer (e.g., the interposer 233) arranged between the first printed circuit board and the second printed circuit board. The second printed circuit board may include a first part (e.g., the main part 201 or the first part 510), and a second part (e.g., the protrusion part 203 or the second part 530) extending from a part of the first part in a third direction (e.g., the direction 205 or the length 501 direction) and having a length (e.g., the width (w2) 207a or the width (w2) 503b in a fourth direction (e.g., the direction 207 or 209 or the width 503 direction) perpendicular to the third direction less than a length (e.g., the width (w1) 209a or the width (w1) 503a) of the first part in the fourth direction. The direction of the first conductive pattern (e.g., the first conductive pattern 511) formed in the first part and the direction of the second conductive pattern (e.g., the second conductive pattern 531) formed in the second part may be substantially perpendicular to each other.

According to various example embodiments, the first conductive pattern and the second conductive pattern may be formed on a ground layer of the second printed circuit board.

According to various example embodiments, the first printed circuit board may include a third surface facing the second printed circuit board and a fourth surface facing the third surface. A size of an area occupied by a conductor formed from the center of the first printed circuit board to the third surface of the first printed circuit board may be greater than a size of an area occupied by a conductor formed from the center of the first printed circuit board to the fourth surface of the first printed circuit board.

According to various example embodiments, the direction of the first conductive pattern may be the fourth direction, and the direction of the second conductive pattern may be the third direction.

According to various example embodiments, a ratio of an area occupied by a conductor included in the second printed circuit board to the entire area of the second printed circuit board may be within a specified range. A ratio of a length of the second conductive pattern in the fourth direction to a length of the second part in the fourth direction may be less than a specified ratio.

According to various example embodiments, the second printed circuit board may include a plurality of layers. The first conductive pattern and the second conductive pattern may be formed on at least one layer spaced a specified distance or more apart from the center of the second printed circuit board among the plurality of layers.

According to various example embodiments, the at least one layer may have a greater spaced distance with the first printed circuit board than at least one another layer among the plurality of layers.

According to various example embodiments, the first printed circuit board may include a first surface facing the second printed circuit board and a second surface facing the first surface, and a weight of at least one electronic component mounted on the first surface may be greater than a weight of at least one electronic component mounted on the second surface.

According to various example embodiments, the direction of the first conductive pattern may be a short axis direction of the second printed circuit board, and the direction of the second conductive pattern may be a long axis direction of the second printed circuit board.

According to various example embodiments, a printed circuit board (e.g., the slave printed circuit board 232 or the printed circuit board 500) may include: a first part (e.g., the main part 201 or the first part 510), and a second part (e.g., the protrusion part 203 or the second part 530) extending from a part of the first part in a first direction (e.g., the direction 205 or the length 501 direction) and having a length (e.g., the width (w2) 207a or the width (w2) 503b) in a second direction (e.g., the direction 207 or 209 or the width 503 direction) perpendicular to the first direction less than a length (e.g., the width (w1) 209a or the width (w1) 503a) of the first part in the second direction. A direction of a first conductive pattern (e.g., the first conductive pattern 511) formed in the first part and a direction of a second conductive pattern (e.g., the second conductive pattern 531) formed in the second part may be substantially perpendicular to each other.

According to various example embodiments, the first conductive pattern and the second conductive pattern may be formed on a ground layer of the printed circuit board.

According to various example embodiments, the direction of the first conductive pattern may be the second direction, and the direction of the second conductive pattern may be the first direction.

According to various example embodiments, a ratio of an area occupied by a conductor included in the printed circuit board to the entire area of the printed circuit board may be within a specified range, and a ratio of a length of the second conductive pattern in the second direction to a length of the second part in the second direction may be less than a specified ratio.

According to various example embodiments, the printed circuit board may include a plurality of layers. The first conductive pattern and the second conductive pattern may be formed on at least one layer spaced a specified distance or more apart from the center of the printed circuit board among the plurality of layers.

According to various example embodiments, the at least one layer may have a greater spaced distance with another printed circuit board than at least one another layer among the plurality of layers.

According to various example embodiments, the first printed circuit board may include a first surface facing the second printed circuit board and a second surface facing the first surface, and a weight of at least one electronic component mounted on the first surface may be greater than a weight of at least one electronic component mounted on the second surface.

According to various example embodiments, the direction of the first conductive pattern may be a short axis direction of the second printed circuit board, and the direction of the second conductive pattern may be a long axis direction of the second printed circuit board.

Figure 6:
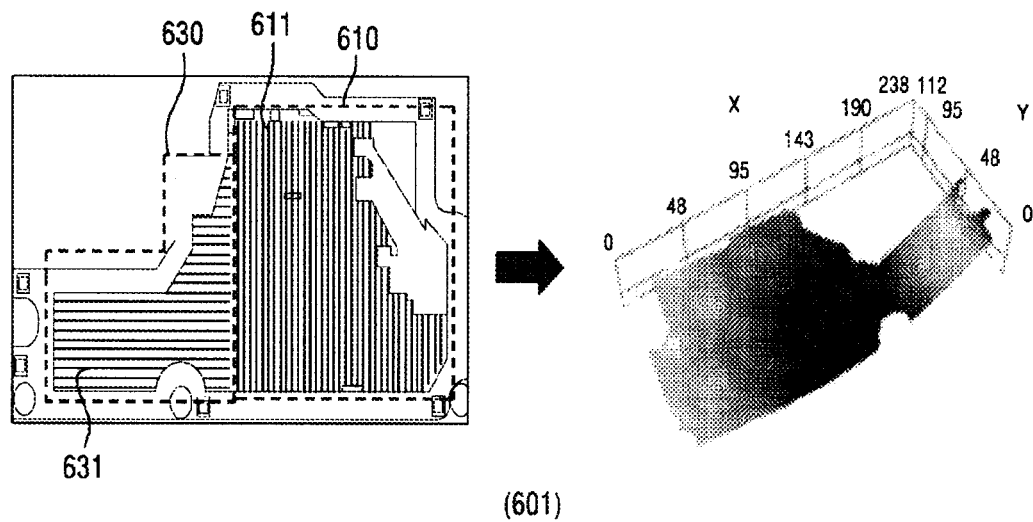
FIG. 6 is a diagram illustrating a warpage direction of a printed circuit board dependent on a direction of a conductive pattern formed in a protrusion part of the printed circuit board according to various embodiments.
Figure 6:
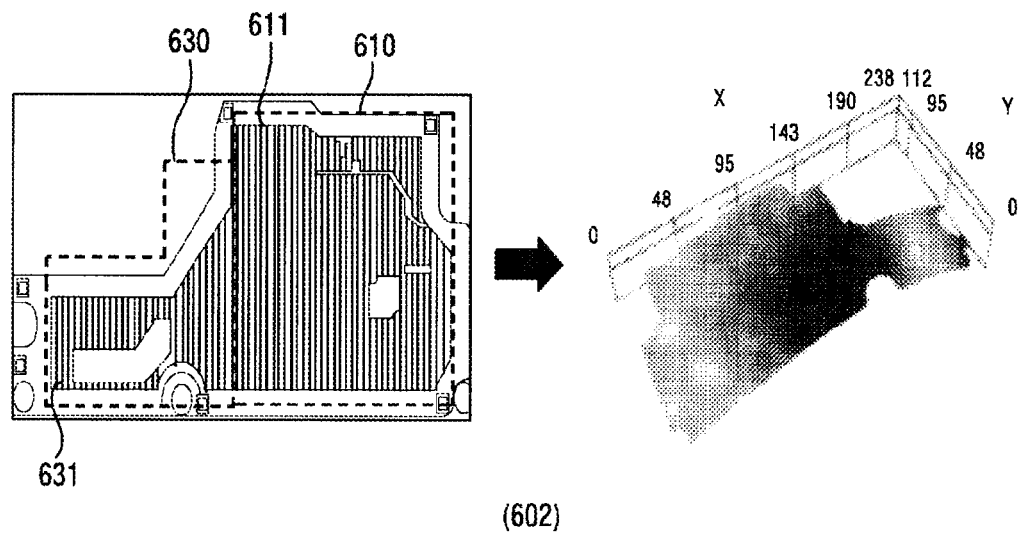
Figure 7:
FIG. 7 is a table showing a warpage direction and warpage size of a printed circuit board dependent on a direction of a conductive pattern formed in a protrusion part of the printed circuit board according to various embodiments.

FIG. 6 is a diagram illustrating a warpage direction of a printed circuit board dependent on a direction of a conductive pattern formed in a protrusion part of the printed circuit board according to various embodiments, and FIG. 7 is a table showing a warpage direction and warpage size of the printed circuit board dependent on the direction of the conductive pattern formed in the protrusion part of the printed circuit board according to various embodiments.

Referring to FIG. 6 and FIG. 7, the printed circuit board (e.g., the printed circuit board 500) may include a main part 610 (e.g., the first part 510 of FIG. 5) and a protrusion part 630 (e.g., the second part 530 of FIG. 5). The main part 610 may be part occupying most of an area of the printed circuit board, and the protrusion part 630 may be part extending from a part of the main part 610. A length (or a width) (e.g., the second width (w2) 503b of FIG. 5) of the protrusion part 630 in a direction substantially perpendicular to a direction of extending from a part of the main part 610 may be less than a length (or a width) (e.g., the first width (w1) 503a of FIG. 5) of the main part 610 in the substantially same direction.

As in a first state 601 of FIG. 6, when a direction of a conductive pattern 631 formed in the protrusion part 630 is different from a direction of a conductive pattern 611 formed in the main part 610, the printed circuit board may have a warpage direction of a smile direction in a high temperature state. In an example, as shown in second data 720 included in a table 700 of FIG. 7, when the direction of the conductive pattern 631 in the protrusion part 630 is a long axis direction (e.g., a direction in which the protrusion part 630 extends from a part of the main part 610), and the direction of the conductive pattern 611 in the main unit 610 is a short axis direction (e.g., a direction perpendicular to the direction in, which the protrusion part 630 extends from a part of the main unit 610) of the printed circuit board, the warpage direction of the printed circuit board (e.g., the slave printed circuit board) in the high temperature state may be the smile direction and a warpage size may be about 335 µm.

In a second state 602 of FIG. 6, when the direction of the conductive pattern 631 formed in the protrusion part 630 is substantially the same as the direction of the conductive pattern 611 formed in the main part 610, the printed circuit board may have a warpage direction of a crying direction (a direction opposite to the smile direction) in the high temperature state. In an example, as shown in third data 730 included in the table 700 of FIG. 7, when the direction of the conductive pattern 631 in the protrusion part 630 and the direction of the conductive pattern 611 in the main part 610 are the substantially same short axis direction, the warpage direction of the printed circuit board in the high temperature state may be the crying direction and the warpage size may be about 245 µm. In another example, as shown in first data 710 included in the table 700 of FIG. 7, even when the direction of the conductive pattern 631 in the protrusion part 630 and the direction of the conductive pattern 611 in the main part 610 are the substantially same long axis direction, the warpage direction of the printed circuit board in the high temperature state may be the crying direction, and the warpage size may be about 73 µm.

Accordingly, the direction of the conductive pattern 631 formed in the protrusion part 630 of the printed circuit board may be designed substantially differently (e.g., in a vertical direction) from the direction of the conductive pattern 611 formed in the main part 610 of the printed circuit board, wherein the printed circuit board may have the warpage direction of the smile direction in the high temperature state.

Figure 8:
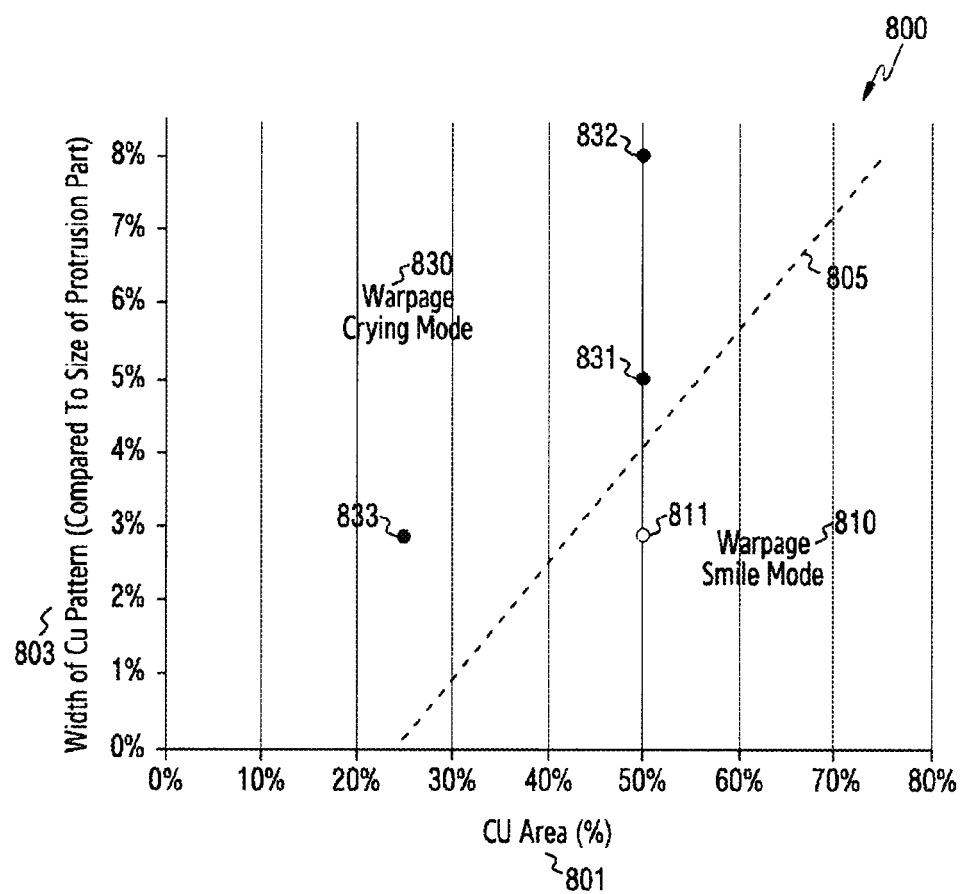
FIG. 8 is a graph illustrating a warpage direction of a printed circuit board dependent on a ratio of a conductive pattern formed in a protrusion part of the printed circuit board and a ratio of a conductor included in the printed circuit board according to various embodiments.

FIG. 8 is a graph showing a warpage direction of a printed circuit board dependent on a ratio of a conductive pattern formed in a protrusion part of a printed circuit board and a ratio of a conductor included in the printed circuit board according to various embodiments, and FIG. 9 is a table showing a warpage direction and warpage size of the printed circuit board dependent on the ratio of the conductive pattern formed in the protrusion part of the printed circuit board and the ratio of the conductor included in the printed circuit board according to various embodiments.

Referring to FIG. 8 and FIG. 9, the printed circuit board (e.g., the printed circuit board 500) may include a main part (e.g., the first part 510 of FIG. 5), and a protrusion part (e.g., the second part 530 of FIG. 5) which is extended from a part of the main part and in which a length (or width) (e.g., the second width (w2) 503b of FIG. 5) of the protrusion part in a direction perpendicular to a direction of extending from a part of the main part is less than a length (or a width) (e.g., the first width (w1) 503a of FIG. 5) of the main part in the same direction.

As shown in a graph 800 of FIG. 8, since a coefficient of thermal expansion of a conductor (e.g., copper) increases in proportion to a volume, as a ratio 801 of an area occupied by a conductor (e.g., a conductive pattern) included in the printed circuit board to the entire area of the printed circuit board increases, it may be easier to control a warpage direction of the printed circuit board in a high temperature state. However, at a high temperature, a mismatch between the coefficient of thermal expansion of the conductor and/or a coefficient of thermal expansion of an insulating layer may increase. Accordingly, the ratio 801 of the area occupied by the conductor included in the printed circuit board to the entire area of the printed circuit board may be included in a specified range.

Since an elastic modulus increases as a ratio 803 of a width of a conductive pattern (e.g., the second conductive pattern 531) formed in the protrusion part to a width of the protrusion part (e.g., a length (the first width (w1) 503b of FIG. 5) of the protrusion part in a direction perpendicular to a direction in which the protrusion part extends from a part of the main part) decreases, it may be easy to control the warpage direction of the printed circuit board in the high temperature state.

However, as in the graph 800 of FIG. 8, when viewed based on a threshold 805 indicating a correlation between the ratio 801 of the area occupied by the conductor included in the printed circuit board to the entire area of the printed circuit board and the ratio 803 of the width of the conductive pattern formed in the protrusion part to the width of the protrusion part, it may be designed that the ratio 801 of the area occupied by the conductor included in the printed circuit board to the entire area of the printed circuit board is included within a specified range (e.g., 50% to 75%), and even the ratio 803 of the width of the conductive pattern formed in the protrusion part to the width of the protrusion part is less than a specified size (e.g., 5%). In an example, as in first data 811 of the graph 800 of FIG. 8 and first data 910 included in a table 900 of FIG. 9 corresponding thereto, when a first condition (e.g., 50%) that the ratio 801 of the area occupied by the conductor included in the printed circuit board to the entire area of the printed circuit board is included within the specified range (e.g., 50% to 75%) is satisfied, and a second condition (e.g., 3%) that the ratio 803 of the width of the conductive pattern formed in the protrusion part to the width of the protrusion part is less than the specified size (e.g., 5%) is satisfied, a warpage direction of the printed circuit board (e.g., the slave printed circuit board) in a high temperature state may be a smile direction (or a smile mode) 810 and a warpage size may be about 23 μm.

When any one of the first condition and the second condition is not satisfied, the warpage direction of the printed circuit board in the high temperature state may be a crying direction (or a crying mode) 830. In an example, as in second data 831 and third data 832 of the graph 800 of FIG. 8, and second data 920 and third data 930 included in the table 900 of FIG. 9 corresponding thereto, when the first condition is satisfied but the second condition is not satisfied, the warpage direction of the printed circuit board in the high temperature state may be the crying direction 830. As in the second data 831 of the graph 800 of FIG. 8 and the second data 920 included in the table 900 of FIG. 9 corresponding thereto, when the first condition (e.g., 50%) that the ratio 801 of the area occupied by the conductor included in the printed circuit board to the entire area of the printed circuit board is included within the specified range (e.g., 50% to 75%) is satisfied, but the second condition (e.g., 5%) that the ratio 803 of the width of the conductive pattern formed in the protrusion part to the width of the protrusion part is less than the specified size (e.g., 5%) is not satisfied, the warpage direction of the printed circuit board in the high-temperature state may be the crying direction 830 and the warpage size may be about 68 μm. Also, as in the third data 832 of the graph 800 of FIG. 8 and the third data 930 included in the table 900 of FIG. 9 corresponding thereto, when the first condition (e.g., 50%) that the ratio 801 of the area occupied by the conductor included in the printed circuit board to the entire area of the printed circuit board is included within the specified range (e.g., 50% to 75%) is satisfied, but the second condition (e.g., 8%) that the ratio 803 of the width of the conductive pattern formed in the protrusion part to the width of the protrusion part is less than the specified size (e.g., 5%) is not satisfied, the warpage direction of the printed circuit board in the high temperature state may be the crying direction 830 and the warpage size may be about 31 μm. In another example, as in fourth data 833 of the graph 800 of FIG. 8 and fourth data 940 included in the table 900 of FIG. 9 corresponding thereto, even when the second condition is satisfied but the first condition is not satisfied, the warpage direction of the printed circuit board in the high temperature state may be the crying direction 830. As in the fourth data 833 of the graph 800 of FIG. 8 and the fourth data 940 included in the table 900 of FIG. 9 corresponding thereto, when the second condition (e.g., 3%) that the ratio 803 of the width of the conductive pattern formed in the protrusion part to the width of the protrusion part is less than a specified size (e.g., 5%) is satisfied, but the first condition (e.g., 25%) that the ratio 801 of the area occupied by the conductor included in the printed circuit board to the entire area of the printed circuit board is included within the specified range (e.g., 50% to 75%) is not satisfied, the warpage direction of the printed circuit board in the high temperature state may be the crying direction 830 and the warpage size may be about 31 μm.

FIG. 10 is a table showing a warpage direction and warpage size of a printed circuit board dependent on a location of a layer of the printed circuit board on which a conductive pattern is formed according to various embodiments.

The printed circuit board (e.g., the printed circuit board 500) may include a main part (e.g., the first part 510 of FIG. 5), and a protrusion part (e.g., the second part 530 of FIG. 5) which is extended from a part of the main part and in which a length (or width) (e.g., the second width (w2) 503b of FIG. 5) of the protrusion part in a direction perpendicular to a direction of extending from a part of the main part is less than a length (or a width) (e.g., the first width (w1) 503a of FIG. 5) of the main part in the same direction. As described above, the warpage direction of the printed circuit board in a high temperature state may be controlled to be a smile direction, through at least one of a method (a control method through a direction of a conductive pattern of the printed circuit board) of designing a direction of a conductive pattern formed in the protrusion part substantially differently (e.g., in a vertical direction) from a direction of a conductive pattern formed in the main part and a method (a control method through a ratio (or a size) of the conductive pattern of the printed circuit board) of designing to satisfy a first condition that a ratio of an area occupied by a conductor included in the printed circuit board to the entire area of the printed circuit board is within a specified range and a second condition that a ratio of a width of the conductive pattern formed in the protrusion part to the width of the protrusion part is less than a specified size. In FIG. 10, in the above-described design methods, a method of controlling a warpage direction of the printed circuit board in the high temperature state to be the smile direction using a location of a layer of the printed circuit board on which the conductive pattern is formed will be described.

Referring to FIG. 10, the printed circuit board may include a plurality of layers. The plurality of layers may include a plurality of conductive layers (e.g., copper foil layers) used as a signal line or a ground region, and a plurality of insulating layers arranged between the conductive layers. According to an embodiment, a first conductive pattern formed in the main part and a second conductive pattern formed in the protrusion part may form a ground region of the printed circuit board. For example, the first conductive pattern and the second conductive pattern may be formed on a ground layer among the plurality of layers. The first conductive pattern and/or the second conductive pattern may be formed on a conductive layer (ground layer) used as a ground region except a region where a signal line is arranged, among the plurality of conductive layers. When the printed circuit board includes the plurality of layers, a moment effect increases as the first conductive pattern and the second conductive pattern move away from the center of the printed circuit board, so it may be easy to control the warpage direction of the printed circuit board.

FIG. 10 shows a result of measuring a warpage size of the printed circuit board according to an area of a conductor arranged on a layer. Comparing first data 1010 and second data 1020 included in a first table 1001 of FIG. 10, it may be seen that the warpage size increases as a difference of a conductive area between layers of the printed circuit board increases. The first data 1010 shows a result that in a state where an area of a conductor included in a first layer to a fourth layer among layers of the printed circuit board is about 80%, and an area of a conductor included in a fifth layer to an eighth layer is about 60%, when the printed circuit board is changed from a room temperature state to a high temperature state, the warpage size is about 1037 μm (397.5−(−639.5)). Also, the second data 1020 shows a result that in a state where the area of the conductor included in the first layer to the fourth layer among the layers of the printed circuit board is about 80%, and the area of the conductor included in the fifth layer to the eighth layer is about 40%, when the printed circuit board is changed from the room temperature state to the high temperature state, the warpage size is about 2371.6 μm (2370.6−199.0). That is, based on the first data 1010 and the second data 1020, it may be seen that in a state where a size of the area of the conductor formed in some (e.g., the first layer to the fourth layer) of the layers of the printed circuit board is similar or identical, when a size of the area of the conductor formed in other layers (e.g., the fifth layer to the eighth layer) has a great difference with a size of the area of the conductor formed in the some layers, even the warpage size is large. Accordingly, in the present disclosure, when the printed circuit board is a slave printed circuit board, the slave printed circuit board may be controlled to be warped in a direction similar to or identical to a warpage direction of a master printed circuit board, by applying the above-described first conductive pattern and second conductive pattern to the layers (e.g., the fifth layer to the eighth layer) located far from the master printed circuit board among the layers included in the slave printed circuit board.

Similarly, comparing third data 1030 and fourth data 1040 included in a second table 1003 of FIG. 10, it may be seen that as a difference of a conductor area between layers of the printed circuit board increases, a warpage size increases. The third data 1030 shows a result that in a state where an area of a conductor included in a first layer to a fourth layer among the layers of the printed circuit board is about 80%, and an area of a conductor included in a fifth layer and a sixth layer is about 40%, and an area of a conductor included in a seventh layer and an eighth layer is about 80%, when the printed circuit board is changed from a room temperature state to a high temperature state, the warpage size is about 68.9 µm (29.5−(−39.4)). The fourth data 1040 shows a result that in a state where the area of the conductor included in the first layer to the fourth layer among the layers of the printed circuit board is about 80%, and the area of the conductor included in the fifth layer and the sixth layer is about 80%, and the area of the conductor included in the seventh layer and the eighth layer is about 40%, when the printed circuit board is changed from the room temperature state to the high temperature state, the warpage size is about 733.8 µm (321.8−(−412.0)). For example, based on the third data 1030 and the fourth data 1040, it may be seen that in a state where a size of the area of the conductor formed in some (e.g., the first layer to the fourth layer) of the layers of the printed circuit board is similar or identical, when a size of the area of the conductor formed in the layer (e.g., the seventh layer and the eighth layer) farther from the some layers than the layer (e.g., the fifth layer and the sixth layer) located close to the some layers has a greater difference with a size of the area of the conductor formed in the some layers, even the warpage size is large. Accordingly, in the present disclosure, when the printed circuit board is a slave printed circuit board, the slave printed circuit board may be controlled to be warped in a direction similar to or identical to a warpage direction of a master printed circuit board, by applying the above-described first conductive pattern and second conductive pattern to the layers (e.g., the seventh layer and the eighth layer) farther from the master printed circuit board layer among the layers included in the slave printed circuit board.

Accordingly, when the printed circuit board includes the plurality of layers, in order to easily control the warpage direction of the printed circuit board, a location of a layer of the printed circuit board on which the conductive pattern (e.g., the first conductive pattern formed in the main part and the second conductive pattern formed in the protrusion part) is formed may be formed on at least one layer (e.g., an outermost layer) spaced a specified distance or more apart from the center of the printed circuit board.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. A printed circuit board assembly comprising:
a first printed circuit board;
a second printed circuit board stacked with the first printed circuit board; and
an interposer arranged between the first printed circuit board and the second printed circuit board,
wherein the second printed circuit board comprises:
a first part; and
a second part extending from a part of the first part in a first direction and wherein a length of the second part in a second direction perpendicular to the first direction is less than a length of the first part in the second direction, and
wherein a first conductive pattern including a plurality of first conductors arranged in parallel is formed in the first part and a second conductive pattern including a plurality of second conductors arranged in parallel is formed in the second part, the plurality of first conductors extend in a direction that is substantially perpendicular to a direction in which the plurality of second conductors extend, and end portions of the plurality of second conductors are provided adjacent to one of the first conductors of the first conductive pattern, and
wherein the second printed circuit board comprises a plurality of layers including a ground layer and the first conductive pattern and the second conductive pattern are included in the ground layer.

2. The printed circuit board assembly of claim 1, wherein the plurality of layers include a plurality of insulating layers and the ground layer is arranged between the plurality of insulating layers.

3. A printed circuit board assembly comprising:
a first printed circuit board;
a second printed circuit board stacked with the first printed circuit board; and
an interposer arranged between the first printed circuit board and the second printed circuit board,
wherein the second printed circuit board comprises:
a first part; and
a second part extending from a part of the first part in a first direction and wherein a length of the second part in a second direction perpendicular to the first direction is less than a length of the first part in the second direction, and
wherein a direction of a first conductive pattern formed in the first part and a direction of a second conductive pattern formed in the second part are substantially perpendicular to each other,
wherein the first printed circuit board comprises a first surface facing the second printed circuit board and a second surface opposite to the first surface, and
a size of an area occupied by a conductor formed from the center of the first printed circuit board to the first surface of the first printed circuit board is greater than a size of an area occupied by a conductor formed from the center of the first printed circuit board to the second surface of the first printed circuit board.

4. The printed circuit board assembly of claim 1, wherein the direction of the first conductive pattern is the second direction, and
the direction of the second conductive pattern is the first direction.

5. The printed circuit board assembly of claim 1, wherein
a ratio of an area occupied by a conductor included in the second printed circuit board to an entire area of the second printed circuit board is within 50% to 75%, and
a ratio of a length of the second conductive pattern in the second direction to a length of the second part in the second direction is less than 5%.

6. The printed circuit board assembly of claim 1, wherein the ground layer is spaced apart from the center of the second printed circuit board.

7. The printed circuit board assembly of claim 6, wherein a distance between the ground layer and the first printed circuit board is greater than a distance between the first printed circuit board and at least one another layer among the plurality of layers.

* * * * *